United States Patent
Kirkpatrick et al.

(10) Patent No.: US 8,618,661 B2
(45) Date of Patent: Dec. 31, 2013

(54) DIE HAVING COEFFICIENT OF THERMAL EXPANSION GRADED LAYER

(75) Inventors: Brian K. Kirkpatrick, Allen, TX (US); Rajesh Tiwari, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 211 days.

(21) Appl. No.: 13/251,498

(22) Filed: Oct. 3, 2011

(65) Prior Publication Data

US 2013/0082385 A1    Apr. 4, 2013

(51) Int. Cl.
*H01L 23/52* (2006.01)
*H01L 23/48* (2006.01)
*H01L 29/40* (2006.01)

(52) U.S. Cl.
USPC ........... 257/751; 257/E21.584; 257/753; 257/758; 438/627; 438/643; 438/653

(58) Field of Classification Search
USPC ........... 257/E21.584, E23.16, 751, 753, 756, 257/758–760, 747, 774–776; 438/627, 643, 438/653, 927
See application file for complete search history.

(56) References Cited

U.S. PATENT DOCUMENTS

| | | | | |
|---|---|---|---|---|
| 5,324,987 | A * | 6/1994 | Iacovangelo et al. | 257/701 |
| 5,793,057 | A * | 8/1998 | Summerfelt | 257/55 |
| 5,850,102 | A * | 12/1998 | Matsuno | 257/635 |
| 6,127,256 | A * | 10/2000 | Matsuno | 438/624 |
| 6,445,023 | B1 * | 9/2002 | Vaartstra et al. | 257/295 |
| 6,458,623 | B1 * | 10/2002 | Goldmann et al. | 438/107 |
| 6,617,037 | B2 | 9/2003 | Sun et al. | |
| 6,706,632 | B2 * | 3/2004 | Sinha | 438/690 |
| 6,974,762 | B2 * | 12/2005 | Gracias et al. | 438/485 |
| 7,282,797 | B2 * | 10/2007 | Emrick et al. | 257/702 |
| 7,507,666 | B2 * | 3/2009 | Nakao et al. | 438/687 |
| 7,795,133 | B2 * | 9/2010 | Nomura | 438/622 |
| 7,846,833 | B2 * | 12/2010 | Kitada et al. | 438/627 |
| 8,349,726 | B2 * | 1/2013 | Besling | 438/637 |
| 2011/0049717 | A1 | 3/2011 | West | |

* cited by examiner

*Primary Examiner* — Chris Chu
(74) *Attorney, Agent, or Firm* — Steven A. Shaw; Wade James Brady, III; Frederick J. Telecky, Jr.

(57) ABSTRACT

A semiconductor die includes a substrate including a topside including circuit elements configured to provide a circuit function. The die includes at least one multi-layer structure including a first material having a first CTE, a second material including a metal having a second CTE, wherein the second CTE is higher than the first CTE. A coefficient of thermal expansion (CTE) graded layer includes at least a dielectric portion that is between the first material and the second material having a first side facing the first material and a second side facing the second material. The CTE graded layer includes a non-constant composition profile across its thickness that provides a graded CTE which increases in CTE from the first side to the second side. The multi-layer structure can be a through-substrate-vias (TSV) that extends through the thickness of the substrate.

23 Claims, 3 Drawing Sheets

DIE HAVING COEFFICIENT OF THERMAL EXPANSION GRADED LAYER

FIELD

Disclosed embodiments relate to semiconductor integrated circuit (IC) die including multi-layer structures that have significant coefficient of thermal expansion mismatches, such as through-silicon-vias.

BACKGROUND

Vias are routinely used in forming semiconductor ICs. Vias may be formed that extend vertically for the full die thickness from the bottomside of the die to one of the contact level or one of the metal interconnect levels, such as metal 1 on the active topside of the die. In the case of silicon substrates, such structures are often referred to as "through-silicon-vias", and are referred to more generally herein as through-substrate-vias (TSVs). The TSV vertical electrical paths are significantly shortened relative to conventional wire bonding technology, generally leading to significantly faster device operation.

TSVs are generally framed by a dielectric liner (or dielectric sleeve) and are filled with an electrically conductive core comprising copper or another electrically conductive filler material to provide the desired low resistance vertical electrical connection. The dielectric liner is generally from about 0.2 μm to 5 μm thick. A diffusion barrier metal layer on the dielectric liner frames the TSV and protects against migration of the TSV filler material into the substrate. In the case of highly mobile metal TSV filler materials that are known to significantly reduce minority carrier lifetimes in the semiconductor, such as copper in the case of silicon, migration can cause problems such as significantly increased junction leakage or a shift in transistor threshold voltage. The diffusion barrier metal layer is typically 100-500 Å thick. In the case of an electroplated metal (e.g., copper) process, a seed layer is generally added after the diffusion barrier metal layer before electroplating the TSV filler metal.

The coefficient of thermal expansion (CTE) is defined as the fractional increase in the length per unit rise in temperature. Copper, as well as some other TSV filler materials, have a significantly higher CTE as compared to conventional semiconductor substrates, such as silicon, and as compared to conventional dielectric liners.

For example, around room temperature copper has a CTE of approximately 17 ppm/° C., whereas silicon has a CTE of approximately 2 to 3 ppm/° C., while silicon dioxide has a CTE of about 0.6 ppm/° C. Such CTE mismatches (ACTE) can result in significant thermally induced stress in the TSV as well as the silicon substrate including the circuitry (e.g. MOS transistors) in the silicon (or bother substrate material) surrounding the TSVs, particularly during certain fab processing subsequent to the fabrication of the TSV (e.g., 360° C. to 410° C. sinters), during assembly and test/operations as may occur during solder reflow (e.g., up to about 260° C.) or during thermo-compressive bonding (e.g., up to 400° C.), during certain temperature cycle reliability testing (e.g., −55° C. to 125° C.), or even during long-term field operation of the die. The CTE mismatch between the dielectric liner and TSV filler material can lead to diffusion barrier metal layer failures (e.g., ruptures or peeling) which allows metal (e.g., copper) migration into the substrate.

A number of solutions have been proposed to reduce problems caused by CTE mismatches for ICs having copper TSVs. In some IC designs, to reduce stress, TSVs are positioned in TSV arrays comprising a plurality of TSVs. For example, reducing the TSV diameter and increasing TSV spacing (i.e. TSV pitch) generally reduces stress. Another known option to reduce stress is to use a TSV filler material that provides a lower ACTE relative to the substrate (e.g., silicon), such as tungsten instead of copper.

SUMMARY

Disclosed embodiments include semiconductor die comprising a substrate having circuit elements configured to provide a circuit function. The die includes at least one multi-layer structure including a first material having a first coefficient of thermal expansion (CTE), a second material including a metal having a second CTE, where the second CTE is higher than the first CTE. A CTE graded layer includes at least a dielectric portion that is between the first material and the second material having a first side facing the first material and a second side facing the second material. The CTE graded layer includes a non-constant chemical composition profile across its thickness that provides a graded CTE which increases in CTE from the first side to the second side, which can be provided by automatically changing the chemical composition during film deposition. Disclosed multi-layer structures can include through-substrate-vias (TSVs) that extend through the full thickness of the substrate which can include disclosed CTE graded liners.

As used herein, "circuit elements" refer to active devices (e.g., transistors), passive devices (capacitors) and interconnects (TSVs). A "metal layer" as used herein includes metals, metal alloys, and metal compounds. A "single phase material" as used herein refers to a homogeneous material that has only a single chemical composition (identity), which can be contrasted with a composite material that is a multi-phase material formed from a combination of materials which differ in chemical composition, which are generally bonded together, and retain their respective identities which allows analysis to identify the different chemical compositions.

DETAILED DESCRIPTION

Figure 1:
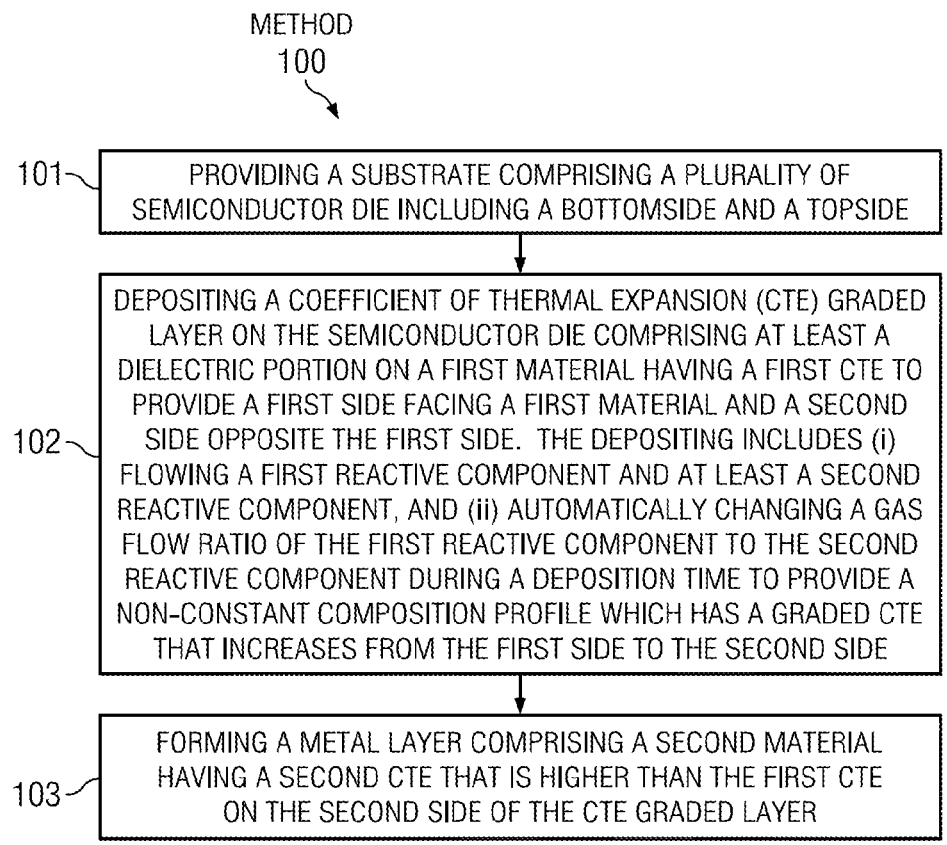
FIG. 1 is a flow chart showing steps in an example method of forming semiconductor die having multi-layer structures including disclosed CTE graded layers, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Disclosed embodiments include methods of fabricating a semiconductor die including disclosed CTE graded layers. FIG. 1 is a flow chart showing steps in an example method 100 of forming semiconductor die having multi-layer structures including disclosed CTE graded layers, according to an example embodiment. Step 101 comprises providing a substrate (e.g., a wafer) comprising a plurality of semiconductor die including a bottomside and a topside. Once method 100 and the other fabrication steps are completed, the topside will include circuit elements configured to provide a circuit function. Example circuit functions include digital signal processors (DSP's), data converters, and power management products. The substrate can comprise a variety of different substrate materials, such as silicon or silicon-germanium, for example.

At least one circuit element comprising a multi-layer structure includes a disclosed CTE graded layer that is formed on the semiconductor die. As noted above, circuit elements include active devices (e.g., transistors), passive devices (e.g., capacitors) and interconnects (metal lines and TSVs).

Step 102 comprises depositing a CTE graded layer on the semiconductor die comprising at least a dielectric portion on a first material having a first CTE to provide a first side facing a first material and a second side opposite the first side. In one embodiment the first material comprises the substrate, such as silicon or silicon-germanium. The first side of the CTE graded layer can directly contact the substrate. The depositing can include (i) flowing a first reactive component and at least a second reactive component, and (ii) automatically changing a gas flow ratio of the first reactive component to the second reactive component during a deposition time to provide a non-constant composition profile which has a graded CTE that increases from the first side to the second side.

The depositing can comprise Atomic Layer Deposition (ALD), Plasma Enhanced Chemical Vapor Deposition (PECVD), or low-pressure chemical vapor deposition (LPCVD). A programmable mass flow controller that has a programmable time varying gas flow feature can be used for automatically changing the gas flow(s). The CTE graded layer can consist of a single phase material throughout. As noted above, a "single phase material" refers to a homogeneous material that has only a single chemical composition (identity), such as silicon oxide, SiN, SiC, SiCN, or polysilicon. As used herein, "polysilicon" refers to a material comprising at least 90% by weight silicon, that includes a plurality of small silicon crystals separated from one another by silicon comprising grain boundaries.

In one embodiment, the automatically changing can comprise varying the oxygen ($O_2$) concentration during the deposition, so for example by decreasing oxygen concentration during deposition the CTE graded liner decreases in oxygen concentration as the deposition proceeds from silicon oxide to polysilicon to provide an increase in CTE as the deposition proceeds. In another embodiment, the automatically changing can comprise varying the carbon concentration as the deposition proceeds so that the CTE graded liner changes in carbon concentration from initially being silicon dioxide (essentially no carbon, e.g. <5 wt. % C) to a higher CTE dielectric including both silicon and carbon (e.g., silicon carbide or some intermediate carbon containing film, SiOC). In yet another embodiment, the automatically changing can comprise varying a nitrogen concentration as the deposition proceeds so that the CTE graded liner changes from silicon dioxide (essentially no nitrogen, e.g. <5 wt. % N) into a higher CTE dielectric including silicon and nitrogen, such as silicon nitride or some intermediate nitrogen rich oxide film, such as SiON.

Step 103 comprises forming a metal layer comprising a second material having a second CTE that is higher than the first CTE on the second side of the CTE graded layer. The metal layer can be formed using a variety of deposition processes, such as Plasma-enhanced chemical vapor deposition (PECVD), low-pressure chemical vapor deposition (LPCVD), or a plating (e.g., electroplating or electroless) process.

In one embodiment the multi-layer structure comprises a plurality TSVs that after backgrind and/or other TSV exposure processing extend through the full thickness of the substrate from its topside to be electrically accessible from its bottomside. In this embodiment, the CTE graded layer comprises a CTE graded liner, the first material comprises the substrate (e.g., silicon), and the method can further comprise depositing a diffusion barrier metal layer directly on the second side of the CTE graded liner so that the metal layer is on the diffusion barrier metal layer, and the second material comprises a metal filler (metal core) on the diffusion barrier metal layer.

The CTE graded liner can be 0.2 μm to 5 μm thick. The diffusion barrier metal layer is typically 100 Å to 500 Å thick. For example, diffusion barrier metal layers can include materials including Ta, W, Mo, Ti, TiW, TiN, TaN, WN, TiSiN or TaSiN, which can be deposited by CVD. In the TSV embodiment, the substrate can comprise silicon, so that the TSVs comprise through-silicon-vias. The metal filler can comprise copper or a copper alloy.

Figure 2A:
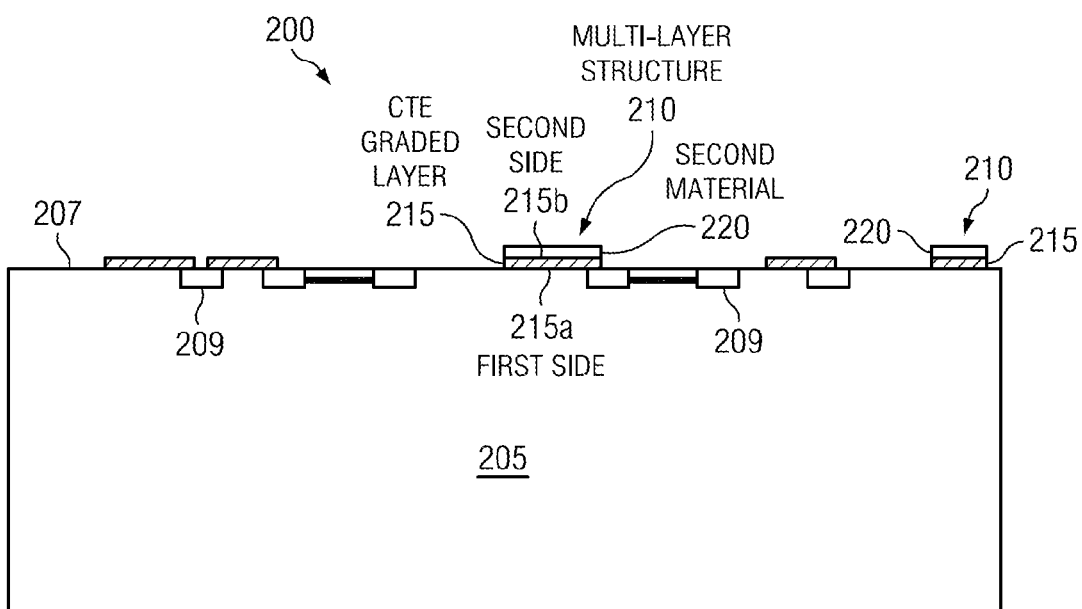
FIG. 2A is a cross sectional depiction of an example semiconductor die having a multi-layer structure including a disclosed CTE graded layer, according to an example embodiment.

FIG. 2A is a cross sectional depiction of an example semiconductor die 200 having a multi-layer structure 210 shown as a capacitor including a disclosed CTE graded layer 215, according to an example embodiment. Semiconductor die 200 comprises a substrate 205 that includes a bottomside 206 and a topside 207. The circuit elements in FIG. 2A on the topside 207 are shown as active devices (e.g., transistors) 209, that along with passive devices such as multi-layer structure 210 and interconnects are configured on the die 200 to provide a circuit function.

In the embodiment shown the CTE graded layer 215 is between a second material 220 and the first material, with the first material shown as being the topside 207 of the substrate 205. However, CTE graded layer 215 can be formed above the topside 207, or within the substrate 205, such as in the case of liners for TSVs (see FIG. 2B having TSVs described below).

The second material 220 includes a metal, and can comprise a single metal, a metal alloy, or a metal compound. The first material shown provided by the topside 207 of substrate 205 in FIG. 2A has a first CTE, and the second material 220 has a second CTE. The second CTE is higher than the first CTE. The CTE graded layer 215 comprises at least a dielectric portion, and has a first side 215a that faces the first material 205 and a second side 215b that faces the second material 220. In some embodiments the CTE graded layer 215 is a dielectric throughout. However, in other embodiments a portion of the CTE graded layer 215 can be a semiconductor, such as polysilicon.

The CTE graded layer 215 includes a non-constant composition profile across its thickness that provides a graded CTE which increases in CTE from the first side 215a to the second side 215b. In one embodiment the graded CTE increases at least fifty (50) percent from the first side 215a to the second side 215b. As shown below in FIGS. 3A-C, the CTE distribution as a function of thickness can take on a wide variety of shapes.

Figure 2B:
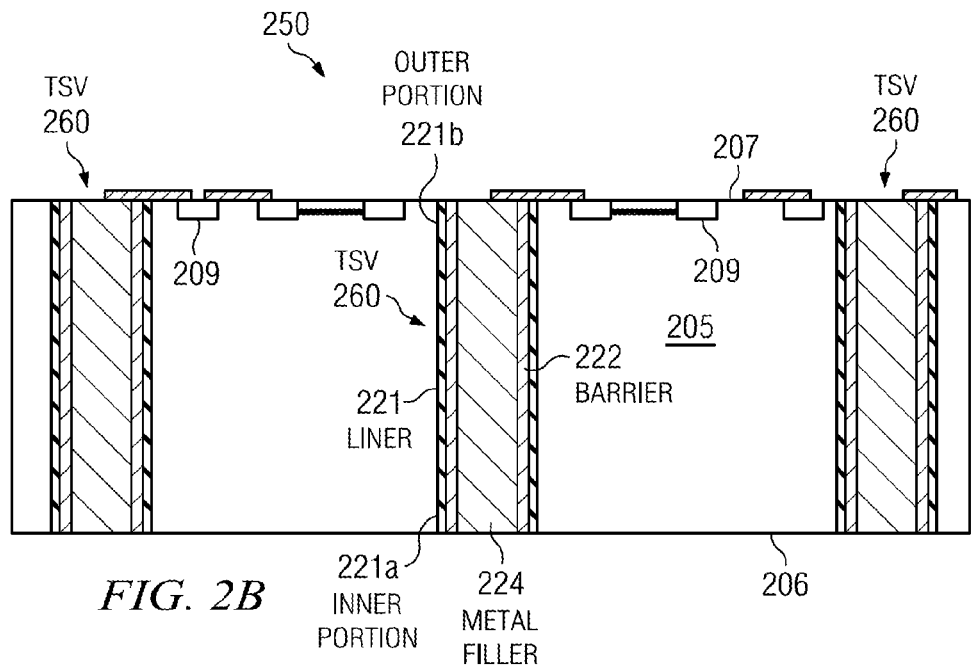
FIG. 2B is a cross sectional depiction of an example semiconductor die having multi-layer structures embodied as TSVs that each include a disclosed CTE graded layer as its liner, according to an example embodiment.

FIG. 2B is a cross sectional depiction of an example semiconductor die 250 having multi-layer structures embodied as TSVs 260 that include a disclosed CTE graded layer as its liner referred to as a CTE graded liner 221, according to an example embodiment. The TSVs 260 shown extend through the full thickness of the substrate 205 from the topside 207 to be electrically accessible from the bottomside 206. Although not shown in FIG. 2B, TSVs 260 can include TSV tips that protrude from the bottomside 206 or a redistribution layer (RDL) having bond pads that is coupled to the TSVs 260 on the bottomside.

TSV 260 is shown including a diffusion barrier metal layer 222 that is directly on the CTE graded liner 221. The inner portion 221(a) of CTE graded liner 221 corresponds to the first side 215(a) shown in FIG. 2A, while the outer portion 221(b) of the CTE graded liner corresponds to the second side 215(b) shown in FIG. 2A. The inner portion 221(a) is shown lining vias formed in the substrate 205.

In one particular embodiment the diffusion barrier metal layer 222 comprises Ta/TaN. The second material having the second CTE that is higher than the first CTE provided by the substrate 205 (that provides the first material) comprises a metal filler 224. The metal filler 224 can comprise copper or a copper alloy. The substrate 205 can comprise silicon, and in this embodiment the TSV 260 thus comprises through-silicon-vias. In one particular embodiment the substrate 205 comprises silicon and the metal filler 224 comprises copper.

As described above, disclosed embodiments recognize that TSVs such as TSVs 260 that include a diffusion barrier metal layer 222 on a liner 221 that are deep into the substrate can be particularly susceptible to stress induced diffusion barrier metal layer 222 failure, such as peeling or cracking. For example, the TSVs can be greater than 20 μm deep, such as about 50 μm deep. In one known TSV arrangement including a silicon substrate, silicon oxide liner, diffusion barrier metal layer and copper metal filler, the CTE mismatch between the silicon oxide liner (silicon oxide having a CTE of approximately 0.6 ppm/° C.) and the metal filler 224 comprising copper (copper has a CTE of approximately 17 ppm/° C.), may can lead to diffusion barrier metal layer 222 failure (e.g., peeling or cracking), resulting in allowing the copper metal filler 224 to migrate into substrate 205.

To address the diffusion barrier metal layer 222 failure (e.g., peeling or cracking) problem, in one embodiment the CTE graded liner 221 deposition can begin by depositing silicon dioxide (the CTE mismatch for silicon oxide is about 5:1 to silicon, with the CTE of silicon having a CTE of approximately 2 to 3 ppm/° C.) and can automatically and progressively (and generally monotonically) change the CTE graded liner 221 film to become more and more silicon rich until the film is essentially polysilicon. The polysilicon can touch the TSV interface with the diffusion barrier metal layer 222 which is proximate to the metal filler 224 (due to the thin diffusion barrier metal layer 222), such as copper, to provide a CTE mismatch to copper of about 6:1. Accordingly, this embodiment reduces the CTE Mismatch between the TSV liner and the metal filler of the TSVs from 30:1 into two separate mismatches each of about 5:1, which can significantly reduce the resulting interfacial stress to reduce diffusion barrier metal layer 222 failures (e.g., peeling or cracking).

Figure 3A:
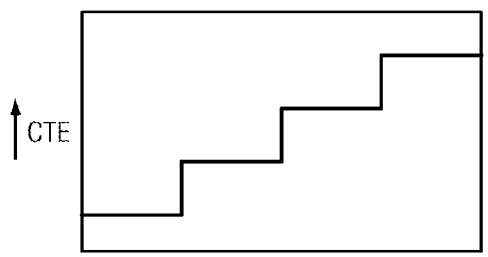
FIGS. 3A-C are depictions of example CTE distribution as a function of the thickness for several example disclosed CTE graded layers, according to example embodiments.
Figure 3B:
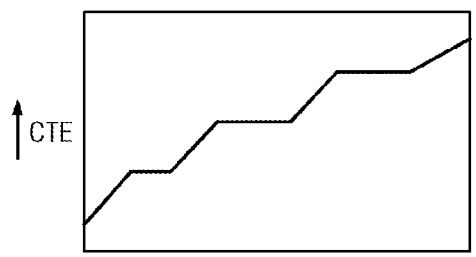
Figure 3C:
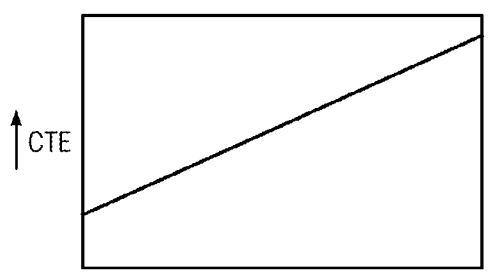

FIGS. 3A-C are depictions of the CTE distribution as a function of the thickness for several example disclosed CTE graded layers, according to an example embodiments. As noted above, a deposition system having at least one programmable mass flow controller that has a programmable time varying gas flow feature can be used for automatically changing of gas flow to provide CTE graded distributions described herein, or variants thereof.

FIG. 3A shows an example monotonically increasing CTE distribution that is in the form of a step function, with four (4) example steps shown that can be achieved through a series of incremental changes in the deposition process. The number of steps can be greater or less than four (4). FIG. 3B shows an example monotonically increasing CTE distribution that is in the form of a ramp function having constant CTE regions between the ramp portions, with four (4) example ramp portions shown. FIG. 3C shows an example monotonically increasing CTE distribution that is in the form of a linear ramp function. As described above, in one embodiment the chemical composition of the CTE graded layer can be automatically changed during film deposition to provide a monotonically increasing CTE by starting the deposition with silicon oxide, transitioning to polysilicon, and ending the deposition with a high CTE dielectric composition such as SiC, SiN, SiCN, or SiOCN.

Figure 4:
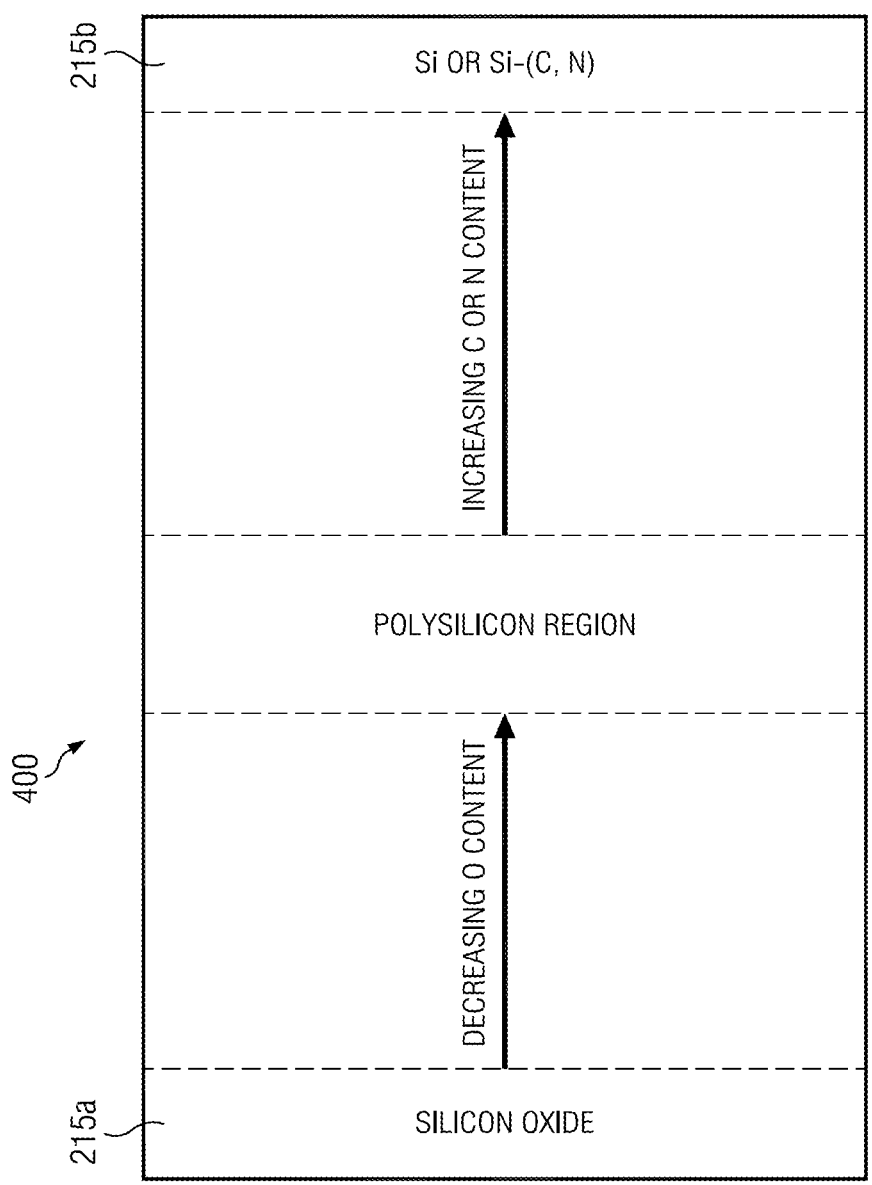
FIG. 4 shows an example composition as a function of the thickness for an example CTE graded layer, with decreasing oxygen concentration as the deposition proceeds such that the composition of the CTE graded layer changes from silicon oxide to polysilicon, then increasing carbon or nitrogen concentration to form a silicon compound, according to an example embodiment.

FIG. 4 shows the composition as a function of thickness for an example CTE graded layer 400, according to an example embodiment. The CTE graded layer 400 includes a non-constant composition profile across its thickness that provides a graded CTE which increases in CTE from its first side 215(a) to its second side 215(b). CTE graded layer 400 features decreasing oxygen (O) concentration such that the composition of the CTE graded layer changes from silicon oxide at and near first side 215(a) to polysilicon between first side 215(a) and second side 215(b), then increasing carbon or nitrogen concentration to form a silicon/carbon or silicon/nitrogen compound at or near the second side 215(b). CTE graded layer 400 can be used for the TSV graded liner 221 for TSVs 260 shown in FIG. 2B.

The circuitry formed on the semiconductor substrate comprises circuit elements that may generally include transistors, diodes, capacitors, and resistors, as well as signal lines and other electrical conductors that interconnect the various circuit elements. Disclosed embodiments can be integrated into a variety of process flows to form a variety of devices and related products. The semiconductor substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:
1. A semiconductor die, comprising:
 a substrate including a bottomside and a topside including circuit elements configured to provide a circuit function;
 at least one multi-layer structure including:
  a first material having a first CTE;
  a second material including a metal having a second CTE, said second CTE higher than said first CTE, and
  a coefficient of thermal expansion (CTE) graded layer comprising at least a dielectric portion between said first material and said second material having a first side facing said first material and a second side facing said second material, wherein said CTE graded layer includes a non-constant composition profile across its thickness that provides a graded CTE which increases in CTE from said first side to said second side.

2. The semiconductor die of claim 1, wherein said first material comprises said substrate and wherein said first side contacts said substrate.

3. The semiconductor die of claim 2, wherein said multi-layer structure comprises a plurality of through-substrate-vias (TSVs) that extend through said substrate from said topside to be electrically accessible from said bottomside, wherein said CTE graded layer comprises a CTE graded liner;

further comprising a diffusion barrier metal layer directly on said second side of said CTE graded liner, wherein said metal layer is on said diffusion barrier metal layer, and wherein said second material comprises a metal filler on said diffusion barrier metal layer.

4. The semiconductor die of claim 3, wherein said substrate comprises silicon, wherein said plurality of TSVs comprise through-silicon-vias, and wherein said metal filler comprises copper.

5. The semiconductor die of claim 1, wherein said CTE graded layer consists of a single phase material throughout.

6. A semiconductor die, comprising:

a substrate including a topside and a bottomside, wherein said topside includes circuit elements configured to provide a circuit function including a plurality of through-substrate-vias (TSVs) that extend through said substrate from said topside to be electrically accessible from said bottomside, wherein said plurality of TSVs include:

a coefficient of thermal expansion (CTE) graded liner comprising at least a dielectric portion that lines vias in said substrate, said CTE graded liner including an inner portion that contacts said substrate and an outer portion that extends outward from said substrate having a thickness in a thickness direction;

a diffusion barrier metal layer on said outer portion of said CTE graded liner, and a metal filler on said diffusion barrier metal layer, wherein said CTE graded liner includes a non-constant composition profile across said thickness direction that provides a graded CTE which increases in said CTE from said inner portion to said outer portion.

7. The semiconductor die of claim 6, wherein said CTE graded liner consists of a single phase material throughout.

8. The semiconductor die of claim 6, wherein said substrate comprises silicon, and wherein said CTE graded liner includes silicon throughout said thickness.

9. The semiconductor die of claim 8, wherein said inner portion of said CTE graded liner comprises silicon oxide, and wherein an oxygen concentration of said CTE graded liner decreases in said thickness direction.

10. The semiconductor die of claim 8, wherein said outer portion comprises silicon carbide or silicon nitride, further comprising and a liner portion between said inner portion and said outer portion that comprises polysilicon.

11. The semiconductor die of claim 6, wherein said graded CTE increases at least fifty percent from said inner portion to said outer portion.

12. The semiconductor die of claim 6, wherein said substrate comprises silicon, wherein said TSVs comprise through-silicon-vias, and wherein said metal filler comprises copper.

13. The semiconductor die of claim 6, wherein said graded CTE monotonically increases in said thickness direction.

14. A method of fabricating a semiconductor die including circuit elements configured to provide a circuit function, comprising:

providing a substrate including a bottomside and a topside, and forming at least one multi-layer structure, including:

depositing a coefficient of thermal expansion (CTE) graded layer comprising at least a dielectric portion on a first material having a first CTE to provide a first side facing said first material and a second side opposite said first side, said depositing including (i) flowing a first reactive component and at least a second reactive component, and (ii) automatically changing a gas flow ratio of said first reactive component relative to said second reactive component during a deposition time to provide a non-constant composition profile which has a graded CTE that increases from said first side to said second side, and forming a metal layer comprising a second material having a second CTE on said second side, wherein said second CTE is higher than said first CTE.

15. The method of claim 14, wherein said first material comprises said substrate and said first side contacts said substrate.

16. The method of claim 15, wherein said multi-layer structure comprises a plurality of through-substrate-vias (TSVs) that extend through said substrate from said topside to be electrically accessible from said bottomside, wherein said CTE graded layer comprises a CTE graded liner;

further comprising depositing a diffusion barrier metal layer directly on said second side of said CTE graded liner, wherein said metal layer is on said diffusion barrier metal layer, and wherein said second material comprises a metal filler on said diffusion barrier metal layer.

17. The method of claim 16, wherein said substrate comprises silicon, wherein said TSVs comprise through-silicon-vias, and wherein said metal filler comprises copper.

18. The method of claim 14, wherein said CTE graded layer consists of a single phase material throughout.

19. The method of claim 14, wherein said depositing comprises Atomic Layer Deposition (ALD), Plasma Enhanced Chemical Vapor Deposition (PECVD), or low-pressure chemical vapor deposition (LPCVD).

20. The method of claim 14, wherein said automatically changing results in a varying an oxygen concentration in said CTE graded layer such that said CTE graded layer changes from silicon oxide to polysilicon during said depositing.

21. The method of claim 14, wherein said automatically changing results in a varying a carbon concentration such that said CTE graded liner changes from silicon dioxide to a dielectric including silicon and carbon during said depositing.

22. The method of claim 14, wherein said automatically changing comprises varying a nitrogen concentration in said CTE graded layer that results in said CTE graded liner changing from silicon dioxide to a dielectric including silicon and nitrogen during said depositing.

23. The method of claim 14, wherein said automatically changing comprises utilizing at least one programmable mass flow controller that has a programmable time varying gas flow feature.

* * * * *